United States Patent [19]

Scholl et al.

[11] 3,805,128

[45] Apr. 16, 1974

[54] CADMIUM SULFIDE THIN FILM SUSTAINED CONDUCTIVITY DEVICE WITH CERMET SCHOTTKY CONTACT

[75] Inventors: Ronald F. Scholl, Malibu; William P. Bleha, Jr., Santa Monica, both of Calif.

[73] Assignee: Hughes Aircraft Company, Culver City, Calif.

[22] Filed: Sept. 1, 1972

[21] Appl. No.: 285,686

Related U.S. Application Data

[62] Division of Ser. No. 140,086, May 4, 1971, Pat. No. 3,716,406.

[52] U.S. Cl. ....................317/235 UA, 317/234 T, 317/235 AC, 317/235 N, 317/235 R

[51] Int. Cl. .................................... H01l 3/20

[58] Field of Search.... 317/234 T, 235 UA, 235 AC

[56] References Cited

UNITED STATES PATENTS

| | | | |
|---|---|---|---|
| 3,331,998 | 7/1967 | Zuleeg | 317/234 T |
| 3,440,499 | 4/1969 | Fasano et al. | 317/234 T |
| 3,319,137 | 5/1967 | Braunstein et al. | 317/234 T |
| 3,509,432 | 4/1970 | Aponick et al. | 317/234 T |

OTHER PUBLICATIONS

Electronics, Oct. 26, 1970, page 40

Graf, "Modern Dictionary of Electronics", Howard W. Sams & Co., Indianapolis, Ind., Publishers, 1968, pp. 78–79.

*Primary Examiner*—Rudolph V. Rolinec
*Assistant Examiner*—William D. Larkins
*Attorney, Agent, or Firm*—W. H. MacAllister, Jr.; F. I. Konzem; R. H. Himes

[57] ABSTRACT

A solid state electrical device which exhibits the property of having different and sustained states of electrical conductivity and method for making same is disclosed. More particularly, a method is disclosed for fabricating an improved solid state thin film electronic storage medium which can retain by conductivity modulation a high resolution image momentarily impressed thereupon by means of either optical or electron beam inputs for an extended period of time (several tens of seconds) provided that an applied electric field is maintained across the solid state element. This phenomenon is hereinafter referred to as "field sustained conductivity." Removal or reversal of the applied electrical field restores the solid state element to its normally insulating condition.

5 Claims, 6 Drawing Figures

CADMIUM SULFIDE THIN FILM SUSTAINED CONDUCTIVITY DEVICE WITH CERMET SCHOTTKY CONTACT

This is a division, of application Ser. No. 140,086, filed May 4, 1971 now U.S. Pat. No. 3,716,406.

BACKGROUND OF THE INVENTION

The present invention represents an improvement in the apparatus and method described in U. S. Pat. No. 3,398,021 entitled, "Method of Making Thin Film Field Sustained Conductivity Device." In this patent, a method of making a field sustained conductivity device is taught comprising the steps of disposing a layer of cadmium sulfide in contact with an aluminum electrode member, and forming a barrier region in said layer of cadmium sulfide by heating the aluminum electrode member and the layer of cadmium sulfide at a temperature of from 200° to 400° C. at least two hours in a sulfur-containing atmosphere. A principal disadvantage of devices made by this method is that they can sustain a potential difference of only a few volts — usually less than ten volts, and operate at relatively low field-sustained current levels (tens to hundreds of micro-amps).

SUMMARY OF THE INVENTION

In accordance with the present invention, an improved thin film field sustained conductivity device is made by providing a "bottom electrode" by first depositing a conductive layer that will not react with cadmium sulfide on a substrate, covering the bottom electrode with a film of cadmium sulfide, thermal processing the film of cadmium sulfide in argon or certain other non-sulfur-containing atmospheres and finally producing a "top electrode" normally composed of two layers on the exposed surface of the cadmium sulfide film. The first layer applied of the double layered top electrode is a composite film of two materials which have diverse conducting properties, e.g., metal/dielectric, metal/semiconductor, semiconductor/dielectric, etc., and the second layer is a conventional metal or other conductive film overlayer.

The device of the present invention has three significant differences as compared with the prior art: namely, the process whereby the cadmium sulfide film is deposited has been modified, the post deposition thermal processing step has been critically altered, and a new type of electrode has been substituted for the negative top electrodes used in prior devices. The device of the present invention has several advantages over the prior art which may be categorized as advantageous in device performance, advantages in ease and safety of fabrication, and the economic advantage of greatly improved reproducibility of the multiple device components. Performance superiority is demonstrated by a significant increase in the sustained conductivity levels attainable (better than an order of magnitude improvement over contemporary devices), by an accompanying increase in the ratio of sustained to erase current, and by a marked improvement in the stability of device characteristics. These improvements resulted primarily from the modification of fabrication processes and the use of a new type of rectifying negative electrode. The secondary results of these changes are that device fabrication is presently less complex, presents less of a safety hazard ($H_2S$ and other sulfur bearing process gases are no longer required), and the improved reproducibility of each fabrication step has led to significantly higher yields.

BRIEF DESCRIPTION OF THE PREFERRED EMBODIMENT

Figure 1:
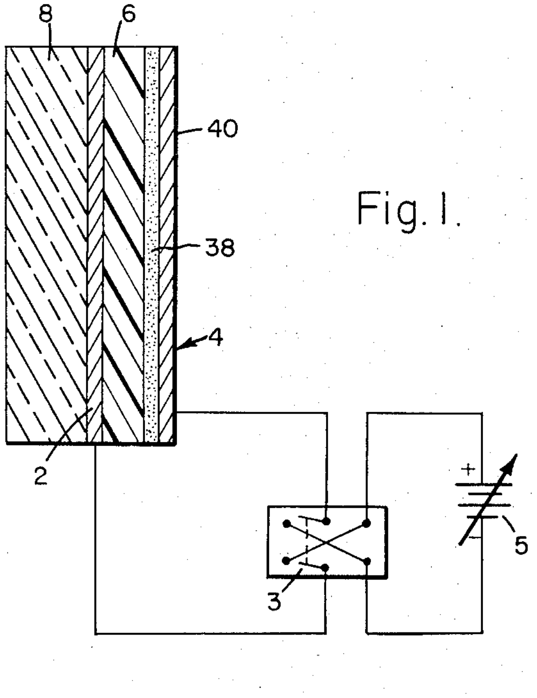
FIG. 1 shows a schematic drawing of a cadmium sulfide thin film field sustained conductivity device fabricated according to the present invention.

Referring now to the drawings and to FIG. 1 in particular, a field sustained conductivity device is show including single layer electrode 2 and double layer electrode 4 in contact with the opposing faces of a thin film 6 of cadmium sulfide semiconductor. It will be understood that because of the thin film nature of the device, a supporting substrate 8 such as glass is provided. For convenience hereinafter the electrode 2 which contacts the substrate 8 will be called the lower or bottom electrode; and the electrode 4 on the exposed face of the semiconductor 6 will be called the top electrode. The top electrode 4 usually includes a composite film 38 of two materials which have diverse conducting properties immediately adjacent the thin film 6 of cadmium sulfide and a metal or other conductive film overlayer 40. Special three layer or single layer contacts are sometimes used. Reversing switch 3 applies a potential of either polarity across electrodes 2, 4 from a source of direct-current potential 5.

It has been found that the electrical characteristics of field sustained conductivity devices fabricated according to the process of the present invention critically depend upon the thermal processing of thin film 6 together with the characteristics of electrode 4. These characteristics include the ability of the cadmium sulfide thin film 6 to increase in conductivity as a result of excitation with light or electron beams, to store these conductivity changes, to integrate successive excitations and to return to the low conductivity state as a result of a momentary reversal or removal of an electric field applied across the semiconductor film 6 through reversing switch 3.

The fabrication of a field sustained conductivity device according to the invention may be classified into four basic processing steps: (1) deposition of the bottom electrode 2 onto the substrate 8; (2) evaporation of the cadmium sulfide thin film 6 onto the bottom electrode 2; (3) thermal processing of the cadmium sulfide thin film 6; and (4) deposition of the top electrode 4 on the cadmium sulfide thin film 6 emerging from step 3. Following this outline, the fabrication of an improved field sustained conductivity device in accordance with the invention will now be described. It will be understood that many variations in the process are available and that dimensions and shape are exemplary only.

Preparation of Substrate 8 and Bottom Electrode 2

The first step in device fabrication is to prepare the support substrate 8 and deposit thereon the so-called "bottom" electrode 2. In practice, commercial substrates are frequently used which consist of a glass member of a specified configuration (usually 1 ½ inches diameter X ⅛ inch thick discs) onto which $SnO_2$:Sb has been spray deposited by the manufacturer. The spray coating in this case serves as a transparent bottom electrode. The only additional preparation required for such precoated substrates 8 is that they be given a high quality cleaning. This may be accomplished by any of a number of techniques familiar to those skilled in the art.

In general, a variety of substrate materials can be used and a variety of conducting materials can be deposited to serve as the bottom electrode. It is only required that the substrate be well cleaned by an appropriate technique prior to the electrode deposition and that the electrode material be nonreactive with respect to the subsequently deposited CdS film. As a practical matter the choice of substrate 8 and bottom electrode 2 materials will be made according to the ultimate application of the device. For example, when the device is to be used in an optical mode or as part of a display device, $SnO_2$:Sb electrodes and glass substrates are a preferred pair of materials since they are both highly transparent. When non-commercial vacuum deposited electrodes are freshly prepared in the laboratory their surfaces require no cleaning or other treatment in preparation for the cadmium sulfide deposition.

Deposition of CdS Film 6

Figure 2:
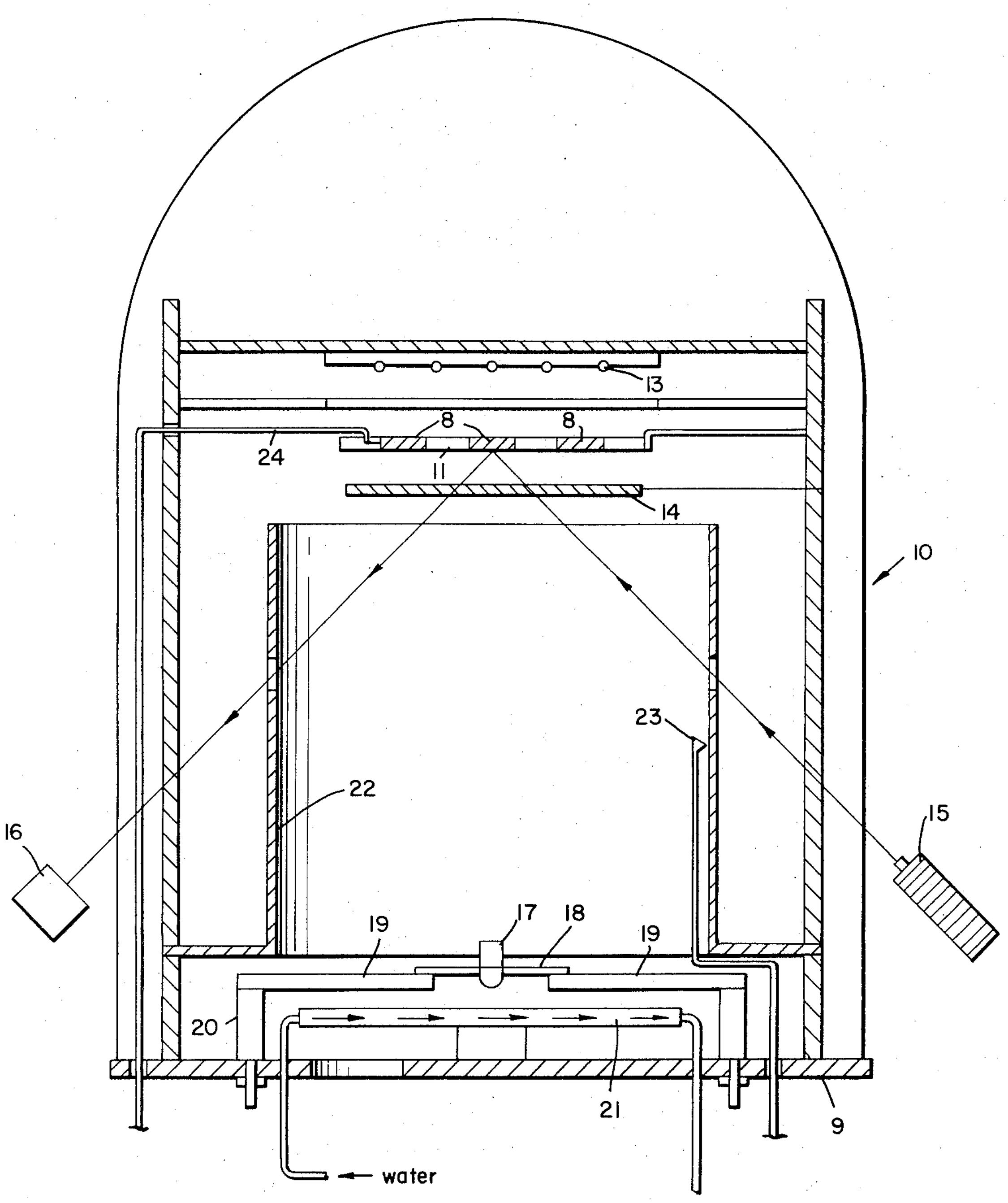
FIG. 2 illustrates apparatus used to carry out the deposition of the cadmium sulfide film step in fabricating the device of FIG. 1.

The second step in the device fabrication is the vacuum deposition of the CdS film 6. The deposition is done in the bell jar of a conventional high vacuum system in the pressure range of $1 \times 10^{-7}$ to $1 \times 10^{-5}$ Torr. The pressure, however, does not appear to be critical. A cross-section drawing of the instrumentation is shown in FIG. 2. The vacuum is enclosed by a baseplate 9 and a glass bell jar 10. The electroded substrates 8 are held by a stainless steel substrate holder 11 and heated by quartz lamps 13. A removable shutter 14 shields the substrates until deposition on them is to be commenced. The thickness of the CdS films is directly and continuously monitored on a substrate by the use of optical interference. This is accomplished with the use of a laser 15 and detector 16 positioned outside the ball jar 10.

The electronic grade CdS powder, in the form of a pressed cylindrical pellet 17, is evaporated from a formed tantalum boat 18 which is resistively heated by current passing through buss bars 19 and current feedthroughs 20. The boat 18 is designed such that as the CdS evaporates, the pressed pellet 17 settles down into the boat. This gives an efficient thermal evaporation over the long period of time required for the deposition of the CdS films. The evaporation rate is controlled by controlling the current to the tantalum boat. The current is set so that $2.5\mu$ of CdS as monitored by optical interference is deposited on the electroded substrates 8 in 1 hour. Typical thicknesses of CdS films are 5 – $12.5\mu$ so that deposition times of 2–5 hours are required. Successful results have been obtained with thicknesses from $2–15\mu$ and evaporation rates from 0.5 to $10.0\mu$/hr. To avoid the heating of the various elements in the deposition chamber by radiation from the tantalum boat 18, a water cooled plate 21 is positioned beneath the boat 18 and extending to the diameter of a cylindrical stainless steel deposition chamber 22 disposed thereabout. The water-cooling is used to maintain the temperature of the wall of chamber 22 as measured by a thermocouple 23 below 60° C. This low temperature, as compared with the substrate 8 temperature of 130° C, as measured by a thermocouple 24, is necessary to obtain the desired characteristics in the films. It should be noted, however, that the important fact is that the chamber 22 and baseplate 21 are maintained at a lower temperature than the substrates 8 and the methods of achieving this can be determined by one skilled in the art. Also the temperatures given can be changed to vary the conductivity and current-voltage characteristics of the CdS films. A range of substrate temperatures from 100° to 200° C and chamber wall temperatures from 40° to 90° C have been used to make Cds films of the given characteristics.

Post Deposition Thermal Processing

Figure 3:
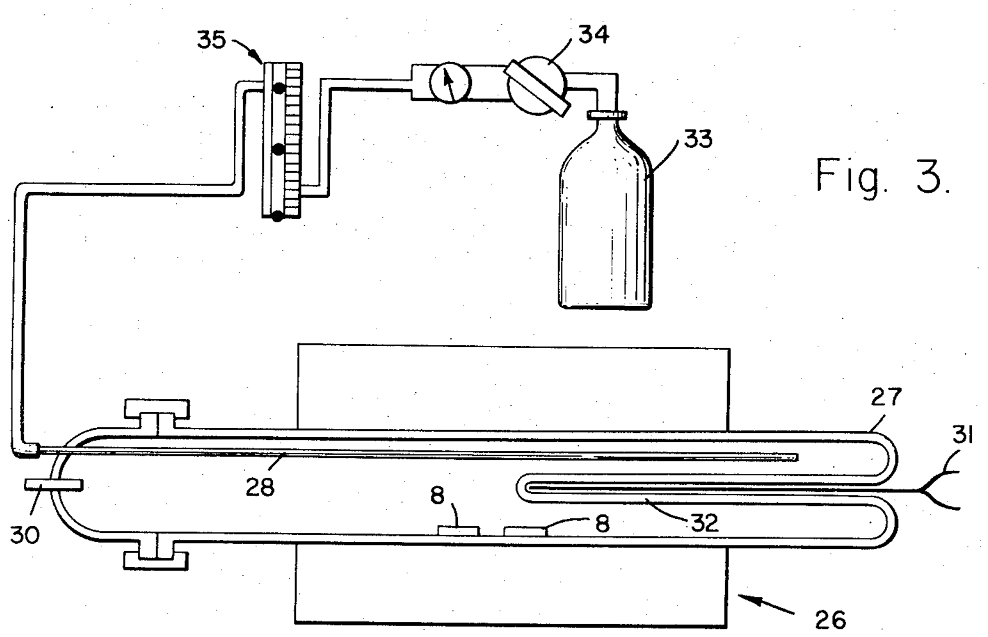
FIG. 3 illustrates apparatus used to carry out the post deposition thermal processing step in fabricating the device of FIG. 1.

The third step in device fabrication is the post-deposition thermal processing of the device as it emerges from step 2. The preferred process under the present invention can be seen by reference to FIG. 3. A controllable furnace 26 is provided with a quartz tube 27 of suitable diameter. A gas inlet tube 28 introduces gas which is preheated passing through the core of the furnace. The gas exits through short exit tube 30. The temperature (for monitoring and control) near the center of the tube and also near the center of the hot zone is provided by a thermocouple 31 sheathed in a quartz tube 32. The devices are placed in the tube near the center of the hot zone. A controllable flow of gas from a gas cylinder 33 is provided by pressure regulator 34 and flowmeter 35.

It should be recognized that other configurations obvious to those skilled in the art, can be used. In operation the following procedure is followed. First the substrates 8 are inserted in the tube 27 and the tube is flushed out with the gas from cylinder 35. Typically Argon is used, but other non-sulfur atmospheres have been used successfully, including nitrogen and air. Then the flow of Argon is typically reduced to 10 CFH (at standard temperature and pressure) and the furnace turned on. Flow rates from 0.1 CFH to 20 CFH have been used with success. The oven is brought to the desired temperature, typically 500° C, and kept at that temperature for the desired time, typically 1 minute. Temperatures from 385° to 525° C and times from 1 minute to 60 minutes have been successfully used. The particular time and temperature used depends on the thickness of the CdS film 6, the substrate 8 material, and the type of gas used. Also the device characteristics, for a given thickness of CdS film, substrate material, and gas, can be altered by changing the temperature and time. After the desired time has elapsed the quartz tube 27 is physically removed from the furnace 26 and allowed to cool in 20 minutes to 70° C, at which point the substrates 8 are removed.

While this rapid cooling produces superior results, devices exhibiting the desired characteristics can also be obtained by leaving the quartz tube 27 in the furnace 26 and turning off the power to the furnace.

Under these circumstances, the substrates 8 cool down about a factor of 10 more slowly.

Deposition of "Top" Electrode 4

The final step in device fabrication is to apply the top electrode to the device as it emerges from step 3. In the present device the top electrode 4 is usually made up of two layers rather than a single layer (although special 3 layer or single layer contacts are sometimes used). The first layer 38 applied of the double layered electrode 4, FIG. 1, is a composite film of two materials which have diverse conducting properties (metal/dielectric, metal/semiconductor, semiconductor/dielectric etc.) and the second layer 40, FIG. 1, is a simple metal film overlayer. Negative contact is made to the device via the metal overlayer 40.

Figure 4:
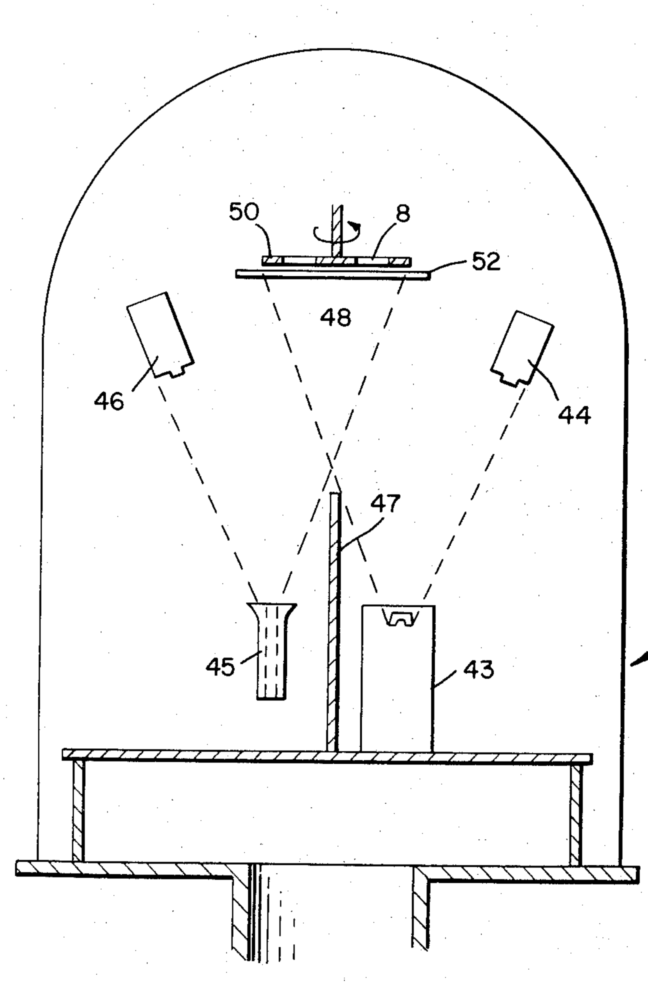
FIG. 4 illustrates apparatus used to carry out the coevaporation of the composite to electrode in the device of FIG. 1.

The preferred type of composite film 38 has been a mixed coevaporated layer of gold and silicon monoxide. This film is prepared in a vacuum changer 42 such as shown in FIG. 4. In practice the Au is evaporated using an electron beam evaporator 43 and the rate of Au evaporation is measured and controlled by a rate monitor 44. Similarly, the SiO is evaporated from a Drumheller source 45 and the rate of SiO evaporation is measured and controlled by rate monitor 46. Although the evaporations take place simultaneously, an optical shield 47 prevents each rate monitor from sensing any of the evaporant from the other source. This shield 47 does, however, allow the evaporant streams to mix in region 48 of the chamber 45. It is in this region 48 that composite film deposition occurs. The substrates 8 as they emerge from step 3 are placed in a rotating substrate holder 50 shielded by a shutter 52 and the chamber 42 is pumped to approximately $10^{-6}$ Torr. The rates of the individual evaporants are then set to a predetermined level (which controls their relative composition in the deposited film), the shutter 52 is opened, and the film is deposited for a fixed time at the preset rates to yield the desired thickness. Typical films are on the order of 2,500 A thick and contain a few percent Au, but other compositions and thicknesses may also be used. Over this composite film 38 a continuous conducting electrode 40 is then deposited to complete the device. Negative contact is made to the device via the metal overlayer 40 on the top electrode 4. The preferred type of composite film has been a mixed coevaporated layer of gold and silicon monoxide. However, other metals have been successfully substituted for gold such as aluminum, silver, platinum and tin and other dielectrics have been substituted for silicon monoxide such as, for example, magnesium oxide. Semiconductor materials such as germanium have also been substituted for the metallic element in the composite film with good results. In addition to the coevaporation technique for obtaining the composite film, three other techniques have also been used with good success. One technique is to precipitate a monolayer of metal particles on the surface of the cadmium sulfide thin film 6 and then apply an overlayer of a dielectric such as silicon monoxide or an overlayer of a semiconductor such as cadmium telluride. Another technique is to first evaporate a very thin discontinuous metal film onto the cadmium sulfide surface followed by an overlayer of dielectric. Each of these techniques require a final overlayer of conducting metal. One additional technique has been found, however, which does not require the final application of a conducting final layer. That technique is to paint on a layer of commercial "silver paint." This material consists of silver particles suspended in a dielectric fluid. Upon drying, the film is sufficiently conducting along its surface so as not to require a conducting overlayer. This type of contact, however, has the disadvantage that it can only be used for non-vacuum optical excitation applications of the device since it is too thick to permit incident electrons to penetrate to the cadmium sulfide film 6 and its outgasses under vacuum.

The above contacting techniques have the common feature that the film surface immediately adjacent to the cadmium sulfide film in all cases consists of islands or patches of a material of one conductivity type (for example, metal) surrounded by regions of a material of a diverse conductivity type (for example, dielectric). It is this common unique feature which, when combined with the cadmium sulfide film as prepared above, gives rise to the enhanced sustained conductivity effects found in the field sustained conductivity device of the present invention.

Device Characteristics

Figure 6:
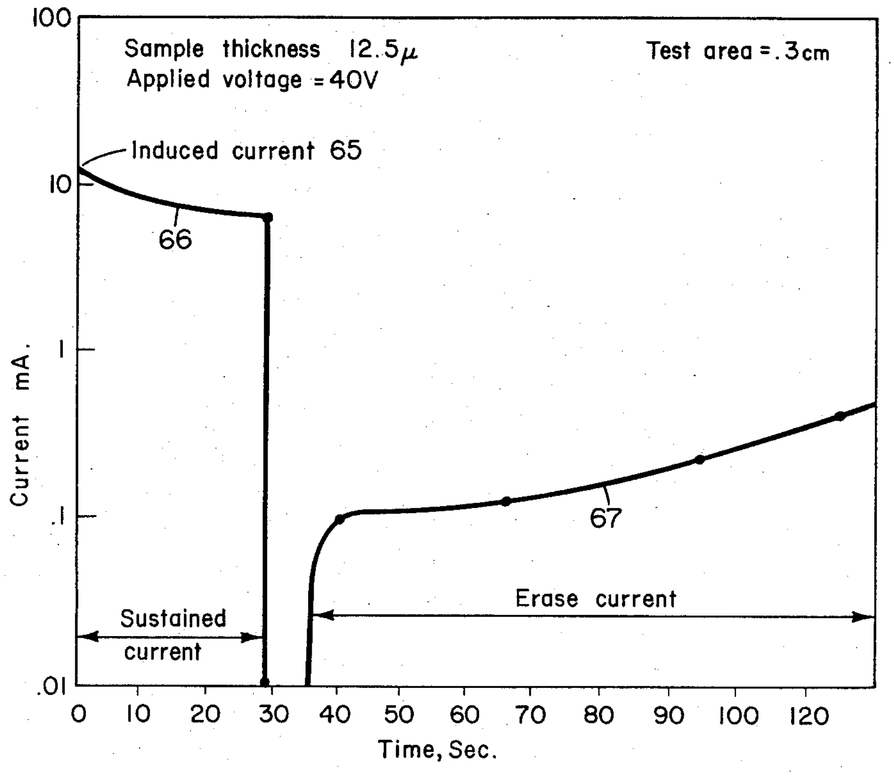
FIG. 5 and 6 illustrate voltage and time versus current characteristics of a representative device according to FIG. 1.
Figure 5:
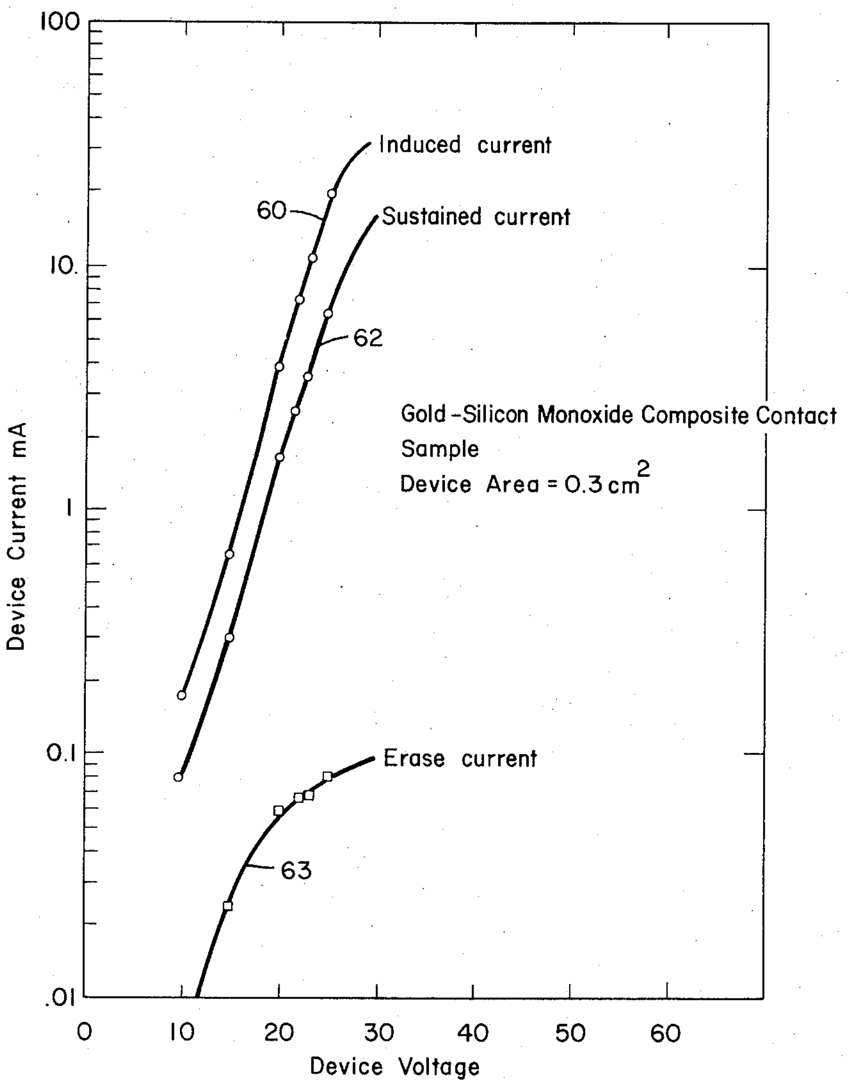

The device characteristics can be seen with reference to FIGS. 5 and 6. In FIG. 5 is shown a current-voltage characteristic of the device with the polarity of applied dc voltage as shown in FIG. 1. This is with the bottom electrode 2 biased positively with respect to the top electrode 4. In FIG. 5 the induced current 60 is the current flowing through the device for a fixed voltage when an electron beam or light is incident on it. The sustained circuit 62 is the current flowing through the device for a fixed voltage 5 sec. after the electron beam or light is removed. The erase current 63 is the current that flows through the device 5 sec. after the fixed voltage has been momentarily reduced to zero or made negative. It has been observed that the voltage can be momentarily reduced to zero for as little as 10 milliseconds and still retain this erase current 63 characteristic. It should be noted that these characteristics show a much higher level voltage operation and also higher sustained current 62 than in contemporary devices. In FIG. 6 is shown the behavior of the current through the device as a function of time. A fixed voltage of 40V is across the device. At time $t = 0$ sec the induced current 65 caused by an incident electron beam or light is indicated. After $t = 0$ sec the electron beam or light is removed and the sustained current level 66 (with 40V still across device) is shown. At time $t = 28$ sec the voltage across the device is changed to zero and no current flows. At time $t = 35$ sec the voltage is changed back to 40V and the erase current 67 is shown until $t = 130$ sec. It should be noted that the erase current 67 remains a smaller fraction of the sustained current 66 for a longer time than in contemporary devices.

It should also be noted that the characteristics in FIGS. 5 and 6 are typical of particular processing schedule of the device. By varying parameters such as thickness of the CdS film 6, the time and temperature of post deposition thermal processing, and the type of contact, a range of different characteristics can be observed.

These can be summarized as:

Voltage across device: 1 – 120V. dc

Induced current through device: 0.01 – 225 mA (0.3 $cm^2$ area)

Sustained current through device: 0.001 – 200 mA (0.3 $cm^2$ area; 5 sec. after removal of electron beam or light)

Erase curent through device: 0.00001 – 1 mA (0.3 $cm^2$ area; 5 sec. after momentary removal of voltage across device).

What is claimed is:

1. An electrical field sustained conductivity device comprising an electrically insulating substrate member having a planar surface, a layer of conductive material disposed on said planar surface thereby to provide a bottom electrode, a layer of thermal processed cadmium sulfide of a thickness greater than 2 and less than 15 microns disposed over said bottom electrode, a composite film of two intermixed materials which have diverse conducting properties, said film being in the form of particles of one material dispersed in the other material, said film being disposed over at least a portion of the exposed surface of said layer of cadmium sulfide, and a metal film disposed over said composite film thereby to provide a top electrode.

2. The electrical field sustained conductivity device as defined in claim 1 wherein said composite film is a mixture of a metal and a dielectric, said metal being selected from a group of metals consisting of aluminum, silver, platinum, tin and gold, and said dielectric being selected from a group of dielectrics consisting of silicon monoxide and magnesium oxide.

3. The electrical field sustained conductivity device as defined in claim 1 wherein said layer of cadmium sulfide is from 5 to 12.5 microns thick.

4. The electrical field sustained conductivity device as defined in claim 1 wherein said composite film is a mixture of a semiconductor material and a dielectric material.

5. The electrical field sustained conductivity device as claimed in claim 4 wherein said semiconductor material is germanium.

* * * * *

PO-1050
(5/69)

UNITED STATES PATENT OFFICE
CERTIFICATE OF CORRECTION

Patent No. 3,805,128 Dated April 16, 1974

Inventor(s) Ronald F. Scholl and William P. Bleha, Jr.

It is certified that error appears in the above-identified patent and that said Letters Patent are hereby corrected as shown below:

After Abstract of the Disclosure, the following paragraph should be inserted:

--The invention herein described was made in the course of or under a contract with the United States Air Force.--

Signed and sealed this 10th day of September 1974.

(SEAL)
Attest:

McCOY M. GIBSON, JR.
Attesting Officer

C. MARSHALL DANN
Commissioner of Patents